United States Patent [19]

Yokoyama et al.

[11] Patent Number: 5,328,566
[45] Date of Patent: Jul. 12, 1994

[54] PROCESS FOR PRODUCING INORGANIC FIBER-BASED PREPREG SHEET AND PROCESS FOR PRODUCING INSULATING LAMINATE

[75] Inventors: Hidekuni Yokoyama, Minami-Shinozaki; Setuo Toyoshima, Tokyo; Takamasa Ibaraki, Minami-Shinozaki, all of Japan

[73] Assignee: Honshu Paper Co., Ltd., Tokyo, Japan

[21] Appl. No.: 823,985

[22] Filed: Jan. 22, 1992

[30] Foreign Application Priority Data

Jan. 22, 1991 [JP] Japan ................................. 3-006011

[51] Int. Cl.$^5$ ............................................. D21H 13/36
[52] U.S. Cl. ............................... 162/152; 162/156; 162/165
[58] Field of Search ............... 162/165, 166, 152, 145, 162/156; 427/96

[56] References Cited

U.S. PATENT DOCUMENTS

| | | | |
|---|---|---|---|
| 2,631,098 | 3/1953 | Redfern | 162/165 |
| 3,039,894 | 6/1962 | Raphael et al. | 162/165 |
| 3,039,915 | 6/1962 | Raphael et al. | 162/165 |
| 4,297,311 | 10/1981 | Sherman et al. | 162/166 |
| 4,615,763 | 10/1986 | Gelorme et al. | 427/96 |

FOREIGN PATENT DOCUMENTS

| | | | |
|---|---|---|---|
| 47-1302 | 2/1951 | Canada | 162/165 |
| 725531 | 1/1966 | Canada | 162/165 |
| 46-4323 | 2/1971 | Japan . | |
| 0029698 | 2/1982 | Japan . | |
| 0214599 | 12/1983 | Japan . | |
| 62-41399 | 2/1987 | Japan . | |
| 2160998 | 6/1990 | Japan . | |

OTHER PUBLICATIONS

Encyclopedia of Chemical Technology, vol. 20, 3rd Edition, John Wiley & Sons (New York) 1982, p. 929.

*Primary Examiner*—W. Gary Jones
*Assistant Examiner*—Brenda Lamb
*Attorney, Agent, or Firm*—Emmanuel J. Lobato; Robert E. Burns

[57] ABSTRACT

A process for producing an inorganic fiber-based prepreg sheet, which comprises preparing a slurry containing 35–80% by weight of a phenolic resin powder of 0.01–100 μm in average particle diameter, 65–20% by weight of an inorganic fiber (the amounts are based on the total amount of the two) and a nonionic high-molecular fixing agent, making the slurry into a sheet in the same manner as in the paper making, and allowing the sheet to contain a silane coupling agent; and a process for producing an insulating laminate, which comprises laminating a prepreg sheet produced by the above process. According to the present invention, there can be produced an inorganic fiber-based prepreg sheet which has high insulating, which is superior in heat resistance, moisture resistance, dimensional stability in thickness direction and through hole ability and which gives rise to no whiting even when made into a laminate; and there can also be produced, from a laminate obtained by laminating the above inorganic fiber-based prepreg sheet, a laminate sheet for printed substrates of high-density wiring and mounting.

12 Claims, No Drawings

PROCESS FOR PRODUCING INORGANIC FIBER-BASED PREPREG SHEET AND PROCESS FOR PRODUCING INSULATING LAMINATE

BACKGROUND OF THE INVENTION

The present invention relates to a process for producing an inorganic fiber-based prepreg sheet, as well as to a process for producing a laminate sheet using the inorganic fiber-based prepreg sheet. More particularly, the present invention relates to a process for producing an inorganic fiber-based prepreg sheet superior in electrical properties (e.g. insulation) and mechanical properties (e.g. heat resistance), as well as to a process for producing a highly insulating laminate sheet suitable for use in printed wiring substrates of high-density mounting.

Laminate sheets of phenolic resin-impregnated paper have heretofore been used for printed substrates widely utilized in household electronic appliances, etc. for their low production cost and good punchability.

The phenolic resin-impregnated paper is obtained by dissolving a phenolic resin in a solvent, impregnating a paper with the resulting solution, and drying the impregnated paper to remove the solvent. The laminate sheet is obtained by laminating necessary sheets of the phenolic resin-impregnated paper and then heating the resulting laminate under pressure.

However, using an organic solvent, the production of the phenolic resin-impregnated paper has had problems of operational danger during production process, bad working environment, odor pollution due to organic solvent and cost for solvent recovery.

Moreover, the phenolic resin-impregnated paper per se has had drawbacks in that it is inferior in insulation, heat resistance, moisture resistance, dimensional stability in thickness direction and through hole ability (e.g. through hole formability).

Moreover, since the wiring and mounting in printed substrates are becoming to be made in a higher density, sheets and laminate sheets for printed substrates have been required to be superior in heat resistance, moisture resistance and dimensional stability in thickness direction, etc. and have high insulation.

Hence, as the sheet for printed substrates, improved in insulation and other properties, there were proposed various inorganic sheets obtained by fixing a thermosetting resin to an inorganic fiber, or various laminate sheets obtained by laminating such inorganic sheets.

Japanese Patent Application Kokai (Laid-Open) No. 41399/1987 describes an inorganic sheet obtained by compounding 5% by weight or more of a small-diameter fiber (average fiber diameter: 3 $\mu$m or less) and fixing a large amount (50-300% by weight) of a filler to an inorgnaic fiber (e.g. glass fiber) by the combined use of cationic and nonionic high-molecular fixing agents, which is said to be suitable also for circuit substrates.

This inorganic sheet, however, contains electric charges and therefore shows reduced insulation and cannot retain insulation such as required in current printed substrates.

Japanese Patent Application Kokai (Laid-Open) No. 160998/1990 describes a paper for insulating laminate sheet, obtained by subjecting a fibrous base material (only paper is used in Examples) and 2 to less than 35% of a thermosetting resin fine powder (0.3-300 $\mu$m) to sheeting. The fibrous base material may be a glass fiber, according to the document.

Japanese Patent Application Kokai (Laid-Open) No. 160998/1990, however, describes, in Examples, only a paper obtained by fixing a phenolic resin powder to a wood pulp fiber, and mentions no specific detail as to how fixing could be made to a glass fiber (fixing to glass fiber is generally difficult).

The above document also describes "a coupling agent can be compounded as necessary". However, since there is generally no clear basis for selection of a particular coupling agent from among many coupling agents available, it is not clear only from the above description what kind of a coupling agent should be selected to increase both the amount of phenolic resin powder fixed and the insulation of sheet.

So far as the present inventor knows, the correlation between thermosetting resin, fixing agent, inorganic fiber and coupling agent has been unclear both qualitatively and quantitatively.

Accordingly, it has been considered difficult to produce a phenolic resin-containing fiber-based prepreg sheet suitable for use in laminate sheets for printed substrates wherein wiring, mounting, etc. are made at a high density, which sheet has high insulation and retains high insulation even after moisture absorption, is superior in heat resistance, moisture resistance, dimensional stability in thickness direction and through hole ability, and gives rise to no whitening even when made into a laminate sheet.

Prepreg sheets obtained by impregnating an inorganic fiber base material with an epoxy resin have been used heretofore but the epoxy resin is expensive. Hence, also from a cost standpoint, there has been desired a phenolic resin-impregnated inorganic fiber-based prepreg sheet of high insulation.

DISCLOSURE OF THE INVENTION

The first object of the present invention is to produce a process for producing an inorganic fiber-based prepreg sheet which has high insulation, which retains the insulation even after moisture absorption, which is superior in heat resistance, moisture resistance, dimensional stability in thickness direction and through hole ability, and which gives rise to no whitening even when made into a laminate sheet.

The above first object can be achieved by the following present invention.

That is, the present invention resides in a process for producing an inorganic fiber-based prepreg sheet, which comprises:

making into a sheet a slurry containing 35-80% by weight of a phenolic resin powder of 0.01-100 $\mu$m in average particle diameter, 65-20% by weight of an inorganic fiber (said amounts are based on the total amount of the two) and a nonionic high-molecular fixing agent, and allowing the sheet to contain a silane coupling agent.

By making into a sheet a slurry containing a phenolic resin powder of 0.01-100 $\mu$m in average particle diameter, an inorganic fiber and a nonionic high-molecular fixing agent, and allowing the sheet to contain a silane coupling agent, to strongly fix 35-80% by weight of the phenolic resin powder to 65-20% by weight of the inorganic fiber (the amounts are based on the total amount of the two), there can be obtained an inorganic fiber base material which has high insulation, which retains the insulation even after moisture absorption, which is superior in heat resistance, moisture resistance, dimensional stability in thickness direction and through hole ability, and which gives rise to no whitening even when made into a laminate sheet.

The second object of the present invention is to provide a process for producing an insulating laminate which has high insulation, which retains the insulation even after moisture absorption, which is superior in heat resistance, moisture resistance, dimensional stability in thickness direction and through hole ability, and which gives rise to no whitening.

The second object of the present invention can be achieved by the following present invention.

The present invention resides in a process for producing an insulating laminate by laminating at least one layer of the sheet obtained by the above present process for producing an inorganic fiber-based prepreg sheet.

By laminating the inorganic fiber-based prepreg sheet having the above properties, there can be obtained an insulating laminate suitable for use in laminate sheets for printed substrates of high-density wiring and mounting, which laminate has high insulation, which retains the insulation even after moisture absorption, which is superior in heat resistance, moisture resistance, dimensional stability in thickness direction and through hole ability, and which gives rise to no whitening.

SPECIFIC DESCRIPTION OF THE INVENTION

Next, the present invention is described specifically by giving preferred embodiments.

Process for producing inorganic fiber-based prepreg sheet

The process for producing an inorganic fiber-based prepreg sheet according to the first present invention comprises:

making into a sheet a slurry containing 35-80% by weight of a phenolic resin powder of 0.01-100 μm in average particle diameter, 65-20% by weight of an inorganic fiber (the amounts are based on the total amount of the two) and a nonionic high-molecular fixing agent, and allowing the sheet to contain a silane coupling agent.

The phenolic resin powder used in the present invention has an average particle diameter of 0.01-100 μm, preferably 0.1-100 μm, particularly preferably 1-20 μm. When the average particle diameter is more than 100 μm, it is difficult to fix the phenolic resin powder to the inorganic fiber. The present invention can be achieved even when the average particle diameter is small, but a lower limit is set for the average particle diameter in view of the industrial handleability.

It was found in the present invention that by allowing a slurry of a phenolic resin powder of 0.01-100 μm in average particle diameter and an inorganic fiber to contain a nonionic high-molecular fixing agent, and subjecting the resulting slurry to the same operation as in the paper making, the slurry can be made into a sheet wherein the phenolic resin powder is fixed to the inorganic fiber in a large amount.

The average particle diameter of the phenolic resin powder was measured by a method for particle diameter measurement by laser beam scattering.

As the phenolic resin, there can be used not only an ordinary phenolic rein of novolac type or resole type but also a new type phenolic resin whose production process and structure are entirely different from those of ordinary phenolic resins.

The new type phenolic resin is obtained by reacting phenol with a formaldehyde resin but by reacting them at a phenol/formaldehyde ratio considerably smaller than 1 in the presence of a large amount of an acid to conduct an addition reaction (occurring in the production of conventional resole type resin) and a polycondensation reaction (occurring in the production of conventional novolac type resin) simultaneously. While the structure and properties of the new type phenolic resin are little known, the phenolic resin is significantly different from ordinary phenolic resins in the large molecular weight, the reactive methylol group present in the molecule, etc. This new type phenolic resin is in actual production in two kinds, with one being non-meltable by heating and the other being heat-meltable and then curable. The latter kind is applicable in the present invention.

Conventional novolac type phenolic resins have been produced by reacting phenol with formalin in the presence of an acid catalyst under the condition of excessive phenol; consequently, they contain, as main components, a trimer to a pentamer of phenol wherein phenol molecules are bonded mainly by methylene groups, and contain no methylol group; therefore, they have had no self-crosslinking property. Conventional resole type phenolic resins have been produced by reacting phenol with formalin in the presence of a basic catalyst under the condition of excessive formalin; they contain, as main components, a monomer to a trimer of phenol containing a large amount of a methylol groups, have very high reactivity, and cannot be prepared as a stable solid (e.g. stable grains); the cured product thereof has had a highly developed three-dimensional structure. Hence, in the new type phenolic resin, by controlling the reaction conditions for its production to allow the obtained resin to have an appropriate number of reactive methylol groups in the molecule, it has been made possible to keep the resin in a stable granular solid and also to allow the resin to have a self-crosslinking property.

The reaction for producing the new type phenolic resin is conducted, for example, by adding a phenol or a phenol and a nitrogen-containing compound having at least active hydrogen to a bath containing an acid and formaldehyde in given concentration ranges, wherein the ratio of the weight of the bath containing the acid and formaldehyde and the weight of the phenol or the phenol and the nitrogen-containing compound containing at least active hydrogen is controlled. Japanese Patent Application Kokai (Laid-Open) No. 17114/1983 (corresponding to U.S. Pat. No. 4,414,379) describes a case of a reaction wherein the bath of an acid and formaldehyde is such that the hydrochloric acid concentration is 3-28% by weight, the formaldehyde concentration is 3-25% by weight and the total concentration of hydrochloric acid and formaldehyde is 10-40% by weight, and wherein the ratio of the weight of the hydrochloric acid-formaldehyde bath/the weight of a phenol and a nitrogen-containing compound having at least active hydrogen is 8 or more.

Japanese Patent Application Kokai (Laid-Open) No. 177011/1982 (corresponding to U.S. Pat. No. 4,414,378) describes a case of a reaction wherein the hydrochloric acid concentration is 5-28% by weight, the formaldehyde concentration is 3-25% by weight, the total concentration of hydrochloric acid and formaldehyde is 15-40% by weight, and the ratio of the weight of the hydrochloric acid-formaldehyde bath/the weight of a phenol is 8 or more. Further, Japanese Patent Application Kokai (Laid-Open) No. 111822/1983 describes a case of a reaction wherein the hydrochloric acid is 5-28% by weight, the formaldehyde concentration is 3-25% by weight, the total concentration of hydrochloric acid and formaldehyde is 15-40% by weight, the ratio of the weight of the hydrochloric acid-formaldehyde bath/the weight of a phenol is 8 or more, and the temperature of the reaction system is controlled at 45° C. or below.

In the present invention, the objects can be achieved by using the phenolic resin powder. However, a thermosetting resin such as epoxy resin, polyimide resin or the like can also be used in view of excellent insulation, absence of free phenol monomer, excellent mechanical strengths, etc.

In the present invention, the amount of the phenolic resin powder contained in the slurry to be made into a sheet is 35-80% by weight (based on the total amount of the phenolic resin powder and the inorganic fiber in the slurry), preferably 40-60% by weight, and the amount of the inorganic fiber is 65-20% by weight.

When the amount of the phenolic resin powder is less than 35% by weight, the resulting prepreg sheet contains a considerable amount of residual air, and the residual air cannot be removed even after lamination of the prepreg sheet and subsequent heating under pressure, giving a laminate sheet with whitening. When the amount of the phenolic resin powder is more than 80% by weight, the proportion of the phenolic resin powder fixed to the inorganic fiber is extremely low, making it, impossible to obtain a sheet of sufficient wet web strength and consequently conduct continuous sheeting.

In the present invention, fixation of the phenolic resin powder to the inorganic fiber in a large amount of 35-80% by weight has been made possible by, as mentioned above, allowing the slurry to contain a nonionic high-molecular fixing agent and conducting sheeting in the same operation as in the paper making. Further, strong fixing of the phenolic resin powder to the inorganic fiber in such a large amount has been made possible by allowing a silane coupling agent to act on the boundaries between the phenolic resin powder and the inorganic fiber bonded to each other by the nonionic high-molecular fixing agent, to reinforce the adhesion of the phenolic resin powder to the inorganic fiber. The thus obtained prepreg sheet has high insulation, retains high insulation even after moisture absorption, is superior in heat resistance, moisture resistance, dimensional stability in thickness direction and through hole ability, and shows no whitenlug even when laminated. All of these matters have been found for the first time in the present invention.

The inorganic fiber used in the present invention includes, for example, a glass fiber, a ceramic fiber and a rock fiber. A glass fiber is particularly preferable in view of the insulation, shot content and economy. Herein, the ceramic fiber includes various ceramic fibers such as alumina fiber, silica-alumina fiber and the like.

In the present specification, the term "glass fiber" is used so as to refer to not only an ordinary glass fiber but also a fine glass fiber known as "microfiber". As the microfiber, a glass fiber having an average diameter of 5 μm or less, preferably 3 μm or less is suitable.

The microfiber acts as a carrier for fixing the phenolic resin powder, contributes to increase in the amount of the phenolic resin powder fixed, and shows an increased effect by adding an nonionic high-molecular fixing agent.

Accordingly, no matter what type of an inorganic fiber is used, the addition of the microfiber to the inorganic fiber can increase the amount of the phenolic resin powder fixed. In particular, when a glass fiber is used as the inorganic fiber, a mixture of an ordinary glass fiber with a microfiber is preferably used.

The amount of the microfiber used is 5-65% by weight (based on the total amount of the inorganic fiber and the phenolic resin powder). When the amount is 5% by weight or more, the microfiber can substantially contribute to increase in proportion of phenolic resin powder fixed. In particular, the addition of the microfiber to an ordinary glass fiber in such an amount can further increase the proportion of phenolic resin powder fixed.

The inorganic fiber can be used singly or in combination but is generally used singly.

In the present invention, a slurry containing the phenolic resin powder, the inorganic fiber and the nonionic high-molecular fixing agent is made into a sheet.

It is because the sheeting of the slurry containing the nonionic high-molecular fixing agent, in the same operation as in the paper making enables, as mentioned above, fixing of the phenolic resin powder of 0.01-100 μm in average particle diameter and because the application of a silane coupling agent to the boundaries between the inorganic fiber and the phenolic resin powder fixed by the nonionic high-molecular fixing agent can reinforce the adhesion of the phenolic resin powder to the inorganic fiber.

That is, in the present invention, it is necessary to add a nonionic high-molecular fixing agent to the slurry in order to obtain an inorganic prepreg sheet which has high insulation, which retains high insulation after moisture absorption, and which is superior in heat resistance, moisture resistance, dimensional stability in thickness direction and through hole ability.

The nonionic high-molecular fixing agent in the present invention is typically a polyethylene oxide, a polyacrylamide, hydroxyethylcellulose or guar gum. Of these, a polyethylene oxide or a polyacrylamide is preferably used.

The amount of the nonionic high-molecular fixing agent used is 0.05-5% by weight, preferably 0.01-2% by weight (based on the total amount of the inorganic fiber and the phenolic resin powder).

The method by which the nonionic high-molecular fixing agent is dispersed in the slurry, is optional, but it is preferable to add the inorganic fiber and the phenolic resin powder to water, stirring the mixture until the mixture becomes a uniform dispersion, and add the nonionic high-molecular fixing agent to the dispersion. The nonionic high-molecular fixing agent may be added as it is, but is preferably added in the form of an aqueous solution. In that case, the concentration of the aqueous solution is 0.01-1% by weight, preferably 0.05-0.5% by weight.

The nonionic high-molecular fixing agent can be added singly or in combination.

In the present invention, the slurry is first made into a sheet and then the silane coupling agent is incorporated into the sheet.

This incorporation of the silane coupling agent into the sheet wherein the phenolic resin powder has been fixed to the inorganic fiber with the nonionic high-molecular fixing agent, is because the action of the silane coupling agent on the boundaries between the phenolic resin powder and the inorganic fiber reinforces the adhesion of the phenolic resin powder to the inorganic fiber.

The silane coupling agent used in the present invention is an agent for enabling bonding between the inorganic fiber (glass fiber, in particular) and the resin (phenolic resin in the present invention), and is a silane compound having a group reactive with inorganic compounds and a group reactive with organic compounds. The agent preferably has an epoxy group, an amino group or a mercapto group as the group reactive with organic compounds. Further, the agent preferably has a methoxy group or an ethoxy group as the group reactive with inorganic compounds.

The silane coupling agent is typically as follows.

$\beta$-(3,4 Epoxycyclohexyl)ethyltrimethoxysilane, $\gamma$-glycidoxypropyltrimethoxysilane, $\gamma$-glycidoxypropylmethyldiethoxysilane, N-$\beta$-(aminoethyl) $\gamma$-aminopropylmethoxysilane, $\gamma$-mercaptopropyltrimethoxysilane, etc. These can be used alone or in combination.

The amount of the silane coupling agent used is 0.01–10% by weight, preferably 0.5–2% by weight (based on the weight of the inorganic fiber).

The silane coupling agent is preferably used in the form of an aqueous solution or suspension. The concentration is preferably about 0.01–10% by weight but has no particular restriction. In order to allow the sheet to contain the silane coupling agent, a typical method is to spray an aqueous solution or suspension of the silane coupling agent, uniformly on the sheet surface. However, any method can be employed as long as the sheet can contain the silane coupling agent uniformly.

The above-mentioned components are used in the process for producing an inorganic fiber-based prepreg sheet according to the present invention, but other components may be added as long as the objects of the present invention are met.

The other components include a filler, a coloring agent (e.g. pigment), a flame retardant, a plasticizer, an organic fiber, organic particles, etc. As the filler, an inorganic filler is preferable and an inorganic fine powder is particularly preferable. The addition of an organic fiber can impart flame retardancy or higher strength to the prepreg sheet and consequently a laminate produced therefrom. It may be added to impart other properties. Specific examples of the organic fiber are an aramid fiber, a nylon fiber, etc., and the addition of these fibers can impart both of flame retardancy and high strength.

In the specific process for producing a prepreg sheet according to the present invention, there is prepared a slurry containing 35–80% by weight of a fine phenolic resin powder of 0.01–100 $\mu$m in average particle diameter, 65–20% by weight of an inorganic fiber (the amounts are based on the total amount of the two) and a nonionic high-molecular fixing agent, and the slurry is made into a sheet according to a general method employed in the paper making. The preparation of the slurry has no particular restriction but can be conducted by adding an aqueous solution of the nonionic high-molecular fixing agent to a slurry wherein the phenolic resin powder and the inorganic fiber are thoroughly dispersed. Then, the obtained sheet is allowed to contain a silane coupling agent, whereby a prepreg sheet is produced. The silane coupling agent is applied to the sheet by, for example, spraying an aqueous solution of the silane coupling agent on the wet-state sheet which is relatively new and fresh from the time of making.

Process for producing insulating laminate

The process for producing an insulating laminate according to the second present invention comprises laminating at least one layer of the inorganic fiber-based prepreg sheet obtained in the above-mentioned first present invention, into a laminate.

The laminate may be a laminate of only the inorganic fiber-based prepreg sheet obtained in the present invention, or may be a laminate between the inorganic fiber-based prepreg sheet obtained in the present invention and other sheet (e.g. an epoxy resin-impregnated glass cloth). In the latter case, the inorganic fiber-based prepreg sheet may be used as the front and back layers of the laminate, or as the front or back layer, or as the intermediate layer between the front and back layers.

The lamination in the present process for laminate production is conducted by laminating the inorganic fiber-based prepreg sheet obtained in the present invention and heating the resulting laminate under pressure to melt and cure the phenolic resin contained in the prepreg sheet. The means for heating under pressure is typically a hot press but can be any means. The pressure applied is 30–200 kgf/cm$^2$, preferably 50–150 kgf/cm$^2$. The heating temperature is 130°–250° C. preferably 150°–200° C. The time for heating under pressure is 10–60 minutes, preferably 15–30 minutes.

Next, the present invention is described more specifically with reference to Examples and Comparative Examples.

EXAMPLE 1

To water were added an aqueous solution of 0.05% by weight of a microfiber (413 M manufactured by Evanaito K.K.) of 4.3 $\mu$m in average fiber diameter, a glass fiber (UPG1/4 ZA508 manufactured by Unitika U.M. Glass Co., Ltd.) of 9 $\mu$m in fiber diameter and a phenol-formaldehyde resin (Bellpearl S-890 manufactured by KANEBO, LTD.). The mixture was thoroughly stirred to prepare a slurry. The content of each component in the slurry was microfiber=30% by weight, glass fiber=20% by weight, and phenolic resin=50% by weight. Each of these weight % is based on the total amount of the microfiber, the glass fiber and the phenolic resin. To the slurry was added a nonionic polymer, i.e. a polyethylene oxide (PEO-15 manufactured by Sumitomo Seika Chemicals Co., Ltd.). The amount of the polyethylene oxide added corresponded to 1% by weight of the total amount of the microfiber, the glass fiber and the phenolic resin in the slurry.

Next, the slurry was made into a sheet of 150 g/m$^2$ in base weight. The sheet was sprayed with $\gamma$-glycidoxypropyltrimethoxysilane (a silane coupling agent) to obtain a sheet.

The sheet was laminated until a base weight of 2,500 g/m$^2$ was reached. The laminate was heated for 30 minutes at a pressure of 150 kgf/cm$^2$ and then subjected to after cure at 165° C. for 120 minutes to form a laminate sheet.

The laminate sheet was measured for insulation resistance in accordance with JIS C 6481. The insulation resistance was $10^{14}$ $\Omega$ at an ordinary state and $10^{12}$ $\Omega$ after 2 hours of boiling in water.

Also, the laminate sheet had a bending strength of 30 kgf/mm$^2$.

Further, the laminate sheet had a linear expansion coefficient in thickness direction, of 34 ppm/°C. (50°–90° C.) as measured by the TMA method.

EXAMPLE 2

The content of each component in the slurry in Example 1 was changed to microfiber=5% by weight, glass fiber=60% by weight and phenolic resin=35% by weight. Further, β-(3,4 epoxycyclohexyl)ethyltrimethoxysilane was used as the silane coupling agent.

The insulation resistance of the laminate sheet obtained was $10^{14}$ Ω at an ordinary state and $10^{11}$ Ω after 2 hours of boiling in water.

EXAMPLE 3

The content of each component in the slurry in Example 1 was changed to microfiber=15% by weight, glass fiber=5% by weight and phenolic resin (GA Type manufactured by Asahi Yukizai Kogyo K.K.)=80% by weight. γ-Mercaptopropyltrimethoxysilane was used as the silane coupling agent.

The insulation resistance of the laminate sheet obtained was $10^{14}$ Ω at an ordinary state and $10^{11}$ Ω after 2 hours of boiling in water.

EXAMPLE 4

The content of each component in the slurry in Example 1 was changed to silica-alumina fiber=50% by weight and phenolic resin=50% by weight.

The insulation resistance of the laminate sheet obtained was $10^{14}$ Ω at an ordinary state and $10^{12}$ Ω after 2 hours of boiling in water.

COMPARATIVE EXAMPLE 1

No coupling agent was used in Example 1, to prepare an inorganic sheet, and a laminate sheet was formed from the sheet. The laminate sheet, however, gave rise to whitening and its insulation resistance was low, i.e. $10^{12}$ Ω at an ordinary state and $10^{6}$ Ω after 2 hours of boiling in water.

COMPARATIVE EXAMPLE 2

The content of each component in the slurry in Example 1 was changed to microfiber=5% by weight, glass fiber=10% by weight and phenolic resin=85% by weight.

The resulting slurry, however, could not be made into a sheet owing to the shortage of the amount of the fiber materials.

COMPARATIVE EXAMPLE 3

The content of each component in the slurry in Example 1 was changed to microfiber=20% by weight, glass fiber=50% by weight and phenolic resin=30% by weight.

However, no transparent laminate sheet could be obtained owing to the shortage of the amount of the resin.

COMPARATIVE EXAMPLE 4

A cationic polyacrylamide was used as the fixing agent in Example 1, to prepare an inorganic sheet. A laminate sheet was formed from the inorganic sheet.

The insulation resistance of the laminate sheet, however, was low, i.e. $10^{13}$ Ω at an ordinary state and $10^{9}$ Ω after 2 hours of boiling in water.

EXAMPLE 5

Using an epoxy resin-impregnated glass cloth as the front and back layers of a laminate sheet to be produced, the inorganic sheet obtained in Example 1 was laminated as the intermediate layer until the laminate sheet had a base weight of 2,500 g/m². The laminate sheet was heated for 30 minutes at a pressure of 150 kgf/cm² and then subjected to after cure at 165° C. for 120 minutes to form a laminate sheet.

The insulation resistance of the laminate sheet was $10^{14}$ Ω at an ordinary state and $10^{12}$ Ω after boiling in water.

The bending strength of the laminate sheet was 35 kgf/mm².

Further, the laminate sheet had a linear expansion coefficient in thickness direction, of 30 ppm/°C. (50°–90° C.) as measured by the TMA method.

EXAMPLE 6

Using the sheet obtained in Example 1, as the front and back layers of a laminate sheet to be produced, a phenolic resin-impregnated paper (the amount of resin impregnated=60% by weight) was laminated as the intermediate layer until the laminate sheet had a base weight of 2,000 g/m². The laminate sheet was heated for 30 minutes at a pressure of 150 kgf/cm² and then subjected to after cure at 165° C. for 120 minutes to form a laminate sheet.

The insulation resistance of the laminate sheet was $10^{13}$ Ω at an ordinary state and $10^{10}$ Ω after 2 hours of boiling.

The bending strength of the laminate sheet was 25 kgf/mm².

Further, the laminate sheet had a linear expansion coefficient in thickness direction, of 110 ppm/°C. (50°–90° C.) as measured by the TMA method.

COMPARATIVE EXAMPLE 5

A phenolic resin-impregnated paper alone was laminated until the resulting laminate sheet had a base weight of 2,500 g/m². The sheet was heated for 30 minutes at a pressure of 150 kgf/cm² and then subjected to after cure at 165° C. for 120 minutes to form a laminate sheet.

The insulation resistance of the laminate sheet was $10^{12}$ Ω at an ordinary state and 109 Ω after 2 hours of boiling in water.

The bending strength of the laminate sheet was 20 kgf/mm². Further, the laminate sheet had a linear expansion coefficient in thickness direction, of 300 ppm/°C. (50°–90° C.) as measured by the TMA method.

The following Table 1 shows the properties of the sheets obtained in Examples 1–4 and Comparative Examples 1–4 and the properties of the laminate sheets produced by laminating the above sheets.

TABLE 1

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Components of sheet | | | | | | | | |
| Glass fiber | 20 | 60 | 5 |  | 20 | 5 | 50 | 20 |
| Silica-alumina fiber |  |  |  | 50 |  |  |  |  |
| Microfiber | 30 | 5 | 15 |  | 30 | 10 | 20 | 30 |
| Phenolic resin | 50 | 35 | 80 | 50 | 50 | 85 | 30 | 50 |
| Fixing agent | | | | | | | | |
| Polyethylene oxide | 1 | 1 | 1 | 1 | 1 | 1 | 1 |  |
| Cationic polyacrylamide |  |  |  |  |  |  |  | 1 |
| Coupling agent | | | | | | | | |
| γ-Glycidoxypropyltrimethoxysilane | 0.1 |  | 0.1 |  |  | 0.1 | 0.1 | 0.1 |
| β-(3,4 Epoxycyclohexyl)ethylmethoxysilane |  | 0.1 |  |  |  |  |  |  |
| γ-Mercaptopropyltrimethoxysilane |  |  |  | 0.1 |  |  |  |  |
| Properties of sheet | | | | | | | | |
| Base weight (g/m$^2$) | 143 | 146 | 131 | 145 | 143 | — | 148 | 144 |
| Yield of phenolic resin (%) | 95 | 99 | 80 | 97 | 95 | — | 99 | 96 |
| Texture | O | O | O | O | O | Sheeting was impossible. | O | O |
| Properties of laminate sheet | | | | | | | | |
| Transparency of laminate sheet | O | O | O | O | O | X | X | O |
| Insulation resistance (ordinary state) Ω | $10^{14}$ | $10^{14}$ | $10^{14}$ | $10^{14}$ | $10^{12}$ | — | — | $10^{13}$ |
| Insulation resistnace (boiled D$_2$/100) Ω | $10^{12}$ | $10^{12}$ | $10^{11}$ | $10^{11}$ | $10^{6}$ | — | — | $10^{9}$ |

The following Table 2 shows the properties of the laminate sheets obtained in Examples 1, 5 and 6 and Comparative Example 5.

TABLE 2

|  | Example 1 | Example 5 | Example 6 | Comparative Example 5 |
|---|---|---|---|---|
| Constitution of layers | | | | |
| Front and back layers | A | B | A | C |
| Intermediate layer | A | A | C | C |
| Insulation | | | | |
| Insulation resistance (ordinary state) Ω | $10^{14}$ | $10^{14}$ | $10^{13}$ | $10^{12}$ |
| Insulation resistnace (boiled D$_2$/100) Ω | $10^{12}$ | $10^{12}$ | $10^{10}$ | $10^{8}$ |
| Mechanical properties | | | | |
| Bending strength (kgf/mm$^2$) | 30 | 35 | 25 | 20 |
| Punchability | O | O | ⊙ | ⊙ |
| Linear expansion coefficient Z (ppm/°C.) (TMA method, average temp.: 50–90° C.) | 34 | 30 | 110 | 300 |

Notes
A refers to a prepreg sheet (obtained by fixing a phenolic resin to a glass fiber) prepared in each Example.
B refers to an epoxy resin-impregnated glass cloth used in Example 5.
C refers to a phenolic resin-impregnated paper used in Example 6 and Comparative Example 5.
Insulation resistance was measured in accordance with JIS C 6481.
Bending strength was measured in accordance with JIS C 6481.
TMA method is an abbreviation of thermomechanical analysis method and is a generic name for measurement methods where periodically-changing loads are applied to a sample and the resultant change amount of the sample is measured. In the present Examples, a sample was subjected to temperature elevation and cooling at a given temperature/min using an extrusion type dilatometer to measure the thermal expansion of the sample. Average temperature was 50–90° C..

We claim:

1. A method for producing an inorganic fiber-based prepreg sheet, which comprises;
   forming into a sheet a slurry containing 35–80% by weight of a phenolic resin powder of 0.01–100 μm in average particle diameter and 65–20% by weight of an inorganic fiber of a total amount of a phenolic resin powder/inorganic fiber combination and containing a nonionic high-molecular fixing agent; and applying to the sheet formed a silane coupling agent.

2. A method for producing an inorganic fiber-based prepreg sheet, which comprises:
   forming into a sheet a slurry containing 35–80% by weight of a phenolic resin powder of 0.01–100 μm in average particle diameter and 65–20% by weight of an inorganic fiber based on the total amount of a phenolic resin powder/inorganic fiber combination, and containing a nonionic high-molecular fixing agent;
   applying to the sheet a silane coupling agent;
   the phenolic resin powder being obtained by conducting an addition reaction and a polycondensation reaction simultaneously at a phenol/formaldehyde ratio considerably smaller than 1 in the presence of a large amount of an acid catalyst, and having a reactive methylol group in the molecule; and
   the phenolic resin powder being curable by heating.

3. A method for producing an inorganic fiber-based prepreg sheet according to claim 1 or 2, in which:
   said slurry further contains at least one member selected of a group, consisting of a filler, a coloring agent, a flame retardant, a plasticizer, an organic fiber and organic particles.

4. A method for producing an inorganic fiber-based prepreg sheet according to claim 1 or 2, wherein the inorganic fiber is at least one selected of a group consisting of a glass fiber, a ceramic fiber, and a rock wool fiber.

5. A method for producing an inorganic fiber-based prepreg sheet according to claim 1 or 2, wherein the inorganic fiber is a microfiber mixture with 5–65% by weight of the total amount of the inorganic fiber and the phenolic resin powder combined.

6. A method for producing an inorganic fiber-based prepreg sheet according to claim 1 or 2, wherein the inorganic fiber is a mixture of an inorganic microfiber with 5–65% by weight of the total amount of the inorganic fiber and the phenolic resin combined, and said microfiber having an average fiber diameter up to 5 μm.

7. A method for producing an inorganic fiber-based prepreg sheet according to claim 1 or 2, wherein the amount of the nonionic high-molecular fixing agent used is 0.05–5% by weight of the total amount of the inorganic fiber/phenolic resin powder combination.

8. A method for producing an inorganic fiber-based prepreg sheet according to claim 1 or 2, wherein the slurry is an aqueous dispersion of the inorganic fiber and the phenolic resin powder obtained by stirring them in water, and the nonionic high-molecular fixing agent is added to said aqueous dispersion.

9. A process for producing an inorganic fiber-based prepreg sheet according to claim 1 or 2, wherein the nonionic high-molecular fixing agent is selected from a group consisting of a polyethylene oxide, a polyacrylamide, hydroxyethylcellulose and guar gum.

10. A method for producing an inorganic fiber-based prepreg sheet according to claim 1 or 2, wherein the amount of the silane coupling agent is 0.01–10% by weight of the total weight of the inorganic fiber.

11. A method for producing an inorganic fiber-based prepreg sheet according to claim 1 or 2, further comprising dissolving or suspending the silane coupling agent in water and spraying the resulting solution or dispersion on the sheet surface uniformly.

12. A method for producing an inorganic fiber-based prepreg sheet according to claim 1 or 2, wherein the silane coupling agent is selected from the group consisting of $\beta$-(3,4 epoxycyclohexyl)ethyltrimethoxy-silane, $\gamma$-glycidoxypropyltrimethoxysilane, $\gamma$-glycidoxypropyl-methyldiethoxysilane, and N-$\beta$-(aminoethyl)-aminopropylmethoxysilane.

* * * * *